US009672301B2

(12) United States Patent
Cao et al.

(10) Patent No.: US 9,672,301 B2
(45) Date of Patent: Jun. 6, 2017

(54) PATTERN SELECTION FOR LITHOGRAPHIC MODEL CALIBRATION

(71) Applicant: ASML NETHERLANDS B.V., Veldhoven (NL)

(72) Inventors: Yu Cao, Saratoga, CA (US); Wenjin Shao, Sunnyvale, CA (US); Jun Ye, Palo Alto, CA (US); Ronaldus Johannes Gijsbertus Goossens, Los Altos, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/246,961

(22) Filed: Apr. 7, 2014

(65) Prior Publication Data

US 2014/0208278 A1 Jul. 24, 2014

Related U.S. Application Data

(63) Continuation of application No. 12/613,244, filed on Nov. 5, 2009, now Pat. No. 8,694,928.
(Continued)

(51) Int. Cl.
*G06F 17/50* (2006.01)
*G03F 1/00* (2012.01)
(Continued)

(52) U.S. Cl.
CPC .............. *G06F 17/50* (2013.01); *G03F 1/14* (2013.01); *G03F 1/44* (2013.01); *G03F 1/68* (2013.01);
(Continued)

(58) Field of Classification Search
USPC ........................................................ 716/53
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| JP | 2007-507890 | 3/2007 |
| JP | 2008-186912 | 8/2008 |

(Continued)

OTHER PUBLICATIONS

Cao, et al., "Optimized Hardware and Software for Fast, Full Chip Simulation", *SPIE*, vol. 5754, pp. 407-414 (2005).
(Continued)

*Primary Examiner* — Bryce Aisaka
(74) *Attorney, Agent, or Firm* — Pillsbury Winthrop Shaw Pittman LLP

(57) ABSTRACT

The present invention relates generally to methods and apparatuses for test pattern selection for computational lithography model calibration. According to some aspects, the pattern selection algorithms of the present invention can be applied to any existing pool of candidate test patterns. According to some aspects, the present invention automatically selects those test patterns that are most effective in determining the optimal model parameter values from an existing pool of candidate test patterns, as opposed to designing optimal patterns. According to additional aspects, the selected set of test patterns according to the invention is able to excite all the known physics and chemistry in the model formulation, making sure that the wafer data for the test patterns can drive the model calibration to the optimal parameter values that realize the upper bound of prediction accuracy imposed by the model formulation.

20 Claims, 8 Drawing Sheets

Related U.S. Application Data

(60) Provisional application No. 61/113,004, filed on Nov. 10, 2008, provisional application No. 61/140,812, filed on Dec. 24, 2008.

(51) Int. Cl.
  *G03F 1/44* (2012.01)
  *G03F 7/20* (2006.01)
  *G06F 17/10* (2006.01)
  *G03F 1/68* (2012.01)

(52) U.S. Cl.
  CPC .......... *G03F 7/705* (2013.01); *G03F 7/70433* (2013.01); *G06F 17/10* (2013.01); *G06F 17/5009* (2013.01)

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 2005/0071039 | A1 | 3/2005 | Mitrovic |
| 2005/0076322 | A1 | 4/2005 | Ye et al. |
| 2007/0031745 | A1 | 2/2007 | Ye et al. |
| 2007/0050749 | A1 | 3/2007 | Ye et al. |
| 2007/0061772 | A1 | 3/2007 | Ye et al. |
| 2007/0061773 | A1 | 3/2007 | Ye et al. |
| 2008/0068667 | A1* | 3/2008 | Tejnil .............................. 358/406 |
| 2008/0068668 | A1* | 3/2008 | Shi ................................. 358/406 |
| 2010/0122225 | A1 | 5/2010 | Cao et al. |

FOREIGN PATENT DOCUMENTS

| | | |
|---|---|---|
| JP | 2009-505400 | 2/2009 |
| JP | 2009-532888 | 9/2009 |
| WO | 2007/019269 | 2/2007 |

OTHER PUBLICATIONS

Spence, "Full Chip Lithography Simulation and Design Analysis—How OPC is Changing IC Design", *SPIE*, vol. 5751, pp. 1-14 (2005).

Wang, et al., "A Simple and Practical Approach for Building Lithography Simulation Models Using a Limited Set of CD Data and SEM Pictures", *SPIE*, vol. 6521, p. 1-9 (2007).

Wu, et al., "Lithography Process Calibration with Applications in Defect Printability Analysis", *SPIE*, vol. 3546, pp. 485-491 (Sep. 1998).

International Search Report issued Feb. 3, 2010 in corresponding PCT/US09/063798.

International Preliminary Report on Patentability and Written Opinion mailed May 19, 2011 in corresponding International Patent Application No. PCT/US2009/063798.

Japanese Office Action mailed Aug. 3, 2011 in corresponding Japanese Patent Application No. 2009-245323.

* cited by examiner

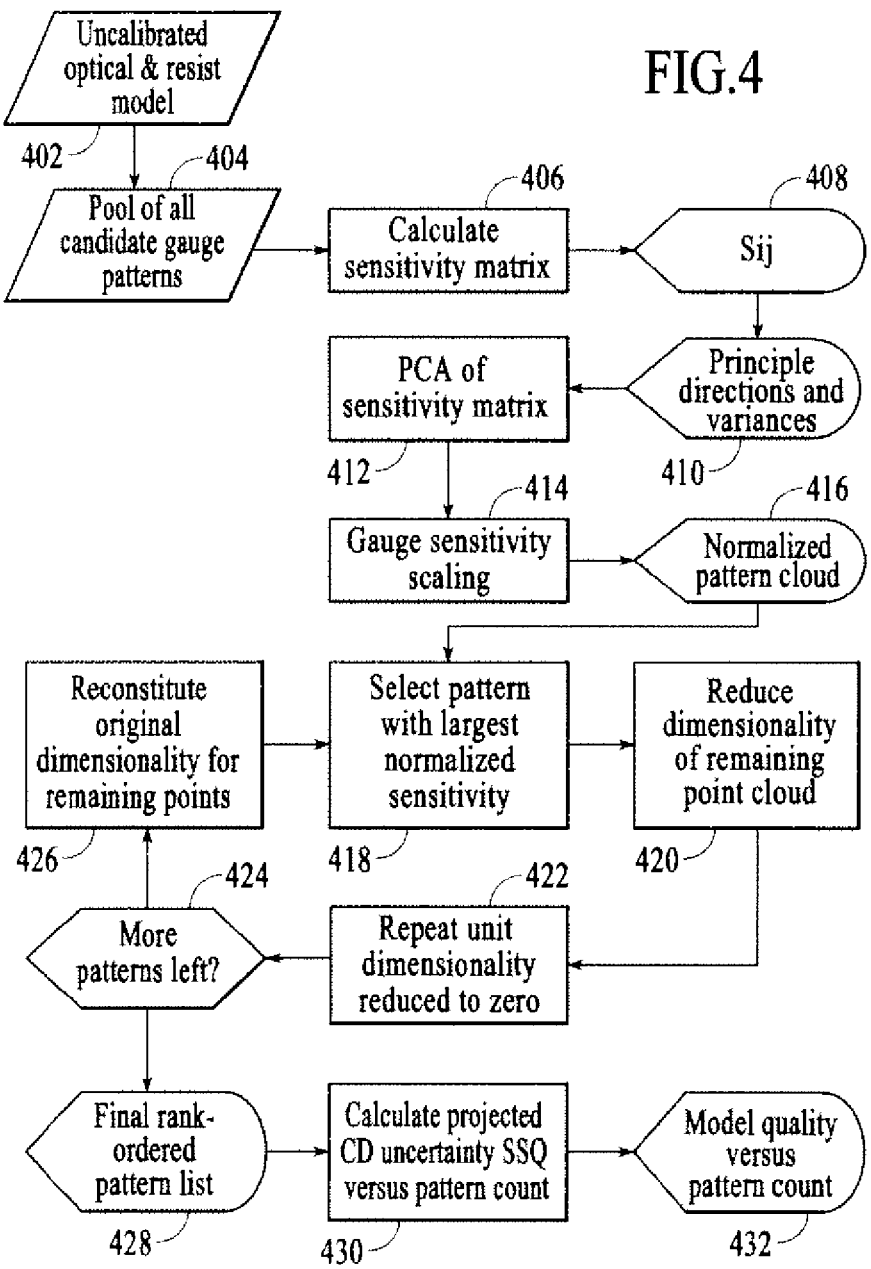

PATTERN SELECTION FOR LITHOGRAPHIC MODEL CALIBRATION

CROSS-REFERENCE TO RELATED APPLICATIONS

This application is a Continuation of U.S. patent application Ser. No. 12/613,244, filed Nov. 5, 2009, now U.S. Pat. No. 8,694,928, which claims priority to U.S. Provisional Application No. 61/113,004, filed Nov. 10, 2008 and U.S. Provisional Application No. 61/140,812, filed Dec. 24, 2008, the contents of each being incorporated herein by reference in their entirety.

FIELD OF THE INVENTION

The technical field of the present invention relates generally to test patterns for model calibration associated with a lithography process, and more specifically to selecting an optimal set of test patterns from a given pool of test patterns.

BACKGROUND OF THE INVENTION

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as "Moore's law". At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process, in which features with dimensions smaller than the classical resolution limit of an optical projection system are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of the projection optics, CD is the "critical dimension"—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as "resolution enhancement techniques" (RET).

As one important example, optical proximity correction (OPC, sometimes also referred to as "optical and process correction") addresses the fact that the final size and placement of a printed feature on the wafer will not simply be a function of the size and placement of the corresponding feature on the mask. It is noted that the terms "mask" and "reticle" are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature edge requires some modification in order to achieve printed patterns that come sufficiently close to the target design. These modifications may include shifting or biasing of edge positions or line widths as well as application of "sub-resolution assist" features that are not intended to print themselves, but will affect the properties of an associated primary feature.

The application of model-based OPC to a target design requires good process models and considerable computational resources, given the many millions of features typically present in a chip design. However, applying OPC is generally not an "exact science", but an empirical, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. Pat. No. 7,003,758 (P-2778) and an article titled "Optimized Hardware and Software For Fast, Full Chip Simulation", by Y. Cao et al., Proc. SPIE, Vol. 5754, 405 (2005). As commercial examples, ASML develops and markets a series of computational lithography ("CL") products for use in design as well as in manufacturing. Examples of these products are Tachyon LMC, Tachyon OPC+ and Pattern Matcher Full Chip from ASML.

Both OPC and RET require robust models that describe the lithography process precisely. Calibration procedures for such lithography models are thus required that provide models being valid, robust and accurate across the process window. Currently, calibration is done using a certain number of 1-dimensional and/or 2-dimensional gauge patterns with wafer measurements. More specifically, those 1-dimensional gauge patterns are line-space patterns with varying pitch and CD, and the 2-dimensional gauge patterns typically include line-ends, contacts, and randomly selected SRAM (Static Random Access Memory) patterns. These patterns are then imaged onto a wafer and resulting wafer CDs or contact energy are measured. The original gauge patterns and their wafer measurements are then used jointly to determine the model parameters which minimize the difference between model predictions and wafer measurements.

In current practice, the selection of gauge patterns is rather arbitrary. They may simply be chosen from experience or randomly chosen from the real circuit patterns. Such patterns are often incomplete or super-complete or both for calibration. In particular, for some parameters, all the patterns may be quite insensitive thus it may be difficult to determine the parameter values due to measurement inaccuracies. While on the other hand, many patterns may have very similar responses to parameter variations thus some of them are redundant and wafer measurements on these redundant patterns waste a lot of resources.

Meanwhile, CL models need to accurately predict the actual on-wafer pattern contours across a very large collection of possible geometric layout patterns. Therefore, both the proper choice of the model formulation to be employed and the accurate determination of values for all model parameters are very important.

Moreover, in the calibration of a CL model, wafer CD measurements for the selected test patterns are needed to optimize the model parameters. The effort involved in collecting such metrology data is often significant. In light of this effort, for the OPC application, these calibrations are typically done only once per technology node per target layer. For CL products in manufacturing, these calibrations need to be done for many scanners and on a somewhat regular basis. Therefore, model calibration procedures should address the issue of how to minimize the number of test structures that need to be measured without compromising the prediction accuracy of the resulting model.

Traditional approaches in model calibration aim primarily to provide a good description of the imaging behavior of those patterns that are known to be important to the physical circuit design community. Typically, this involves a substantial number of pattern types, each instantiated over an appropriate range of geometric variations. The most important example is line CD versus pitch for the poly layer, for a number of frequently used transistor channel lengths (poly line CD) and from dense lines (minimum pitch) to isolated lines. However, in modern lithography, the optical range of influence (ambit) is much larger than the typical test structure and therefore it is no longer true that accurate modeling of a pre-selected number of relatively small test patterns guarantees accurate prediction of these patterns in their actual circuit environments.

The wafer data collection is driven by this same focus—the vast majority of test patterns used in model calibration are the same patterns for which a good description is required. The same focus expresses itself also in the selection of the geometric variations. For a given pattern type, many geometric instances are selected in regions where the imaging or electrical response varies quickly, irrespective of the underlying physics and the number of model parameters involved in these change. A good example is region around the shortest poly CD, i.e. the shortest design-rule-compliant transistor gate length. Because the threshold voltage—and with it the on and off-state current—vary quickly as a function of the designed poly gate CD, tradition dictates to utilize very many test structures with closely spaced gate CDs in this region.

As a consequence of the approach described above, and after an often extensive, iterative process of fine-tuning the weights for the various pattern types, the models do in fact deliver good prediction for patterns that have been characterized and in addition interpolate fairly well for intermediate geometries. As such, these methods have served adequately for their primary use case, which was optical proximity correction.

However, this traditional approach also has some serious drawbacks. Firstly, the strong focus on predefined patterns means that there is no explicit consideration for proper coverage of model parameters and for "exciting the physics" represented by these parameters. Due to a lack of discriminating patterns, patterns can be poorly determined or they can exhibit a high degree of degeneracy with other parameters. Either way, the methods routinely fail to properly describe the change in imaging behavior outside the conditions included in the model characterization.

Secondly, for some of the physics and associated model parameters that are captured by the calibration method, the approach is not economical and too many measurements provide essentially redundant information.

The increased use of computational lithography models outside their original conventional application in OPC implies that the model calibration procedures need to be adjusted also, such that the resulting models are a) better in predicting imaging behavior for pattern types not included in the calibration test data, b) better in predicting imaging behavior for variations in the lithographic processing conditions (mask, scanner, resist, or etch related), and c) more frugal in terms of the amount of metrology needed. Accordingly, a need exists to address these and other shortfalls of the traditional methods.

SUMMARY OF THE INVENTION

The present invention provides a number of innovations in the area of test pattern selection for model calibration that address the requirements mentioned above, among others. According to some aspects, the pattern selection algorithms of the present invention can be applied to any existing pool of candidate test patterns. These patterns may stem from any combination of the following sources: A test mask included as part of a tool such as Scanner Matcher; A test mask developed by OPC customers as part of their OPC modeling efforts; Patterns from an actual product reticle in use by an OPC customer. According to some aspects, the present invention automatically selects those test patterns that are most effective in determining the optimal model parameter values from an existing pool of candidate test patterns, as opposed to designing optimal patterns. According to additional aspects, the selected test pattern according to the invention is able to excite all the known physics and chemistry in the model formulation, making sure that the wafer data for the test patterns can drive the model calibration to the optimal parameter values that realize the upper bound of prediction accuracy imposed by the model formulation.

In furtherance of these and other aspects, a method of test pattern selection for computational lithography model calibration according to embodiments of the invention includes identifying a pool of candidate test patterns, identifying a set of lithography model parameters; and automatically selecting a set of test patterns from the pool of candidate test patterns that are most effective in determining optimal values of the identified model parameters.

In additional furtherance of these and other aspects, a method of test pattern selection for computational lithography model calibration according to embodiments of the invention includes preparing a sensitivity matrix corresponding to a pool of candidate test patterns and a set of model parameters; performing calculations using the sensitivity matrix; and selecting a set of test patterns from the pool of candidate test patterns based on the calculations.

In yet additional furtherance of these and other aspects, a method of test pattern selection for computational lithography model calibration according to embodiments of the invention includes developing a sensitivity matrix that corresponds to a cost function associated with accuracy of a lithography model, wherein the sensitivity matrix establishes a relationship between a pool of candidate test patterns and a set of parameters of the lithography model; and selecting a set of test patterns from the pool of candidate test patterns by performing calculations on the sensitivity matrix.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed herein may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

Another patterning alternative is a programmable LCD array. An example of such a construction is given in U.S. Pat. No. 5,229,872, which is incorporated herein by reference.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 4 is a flowchart illustrating an example method of selecting a set of test gauges from a pool of test gauges according to aspects of the invention;

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
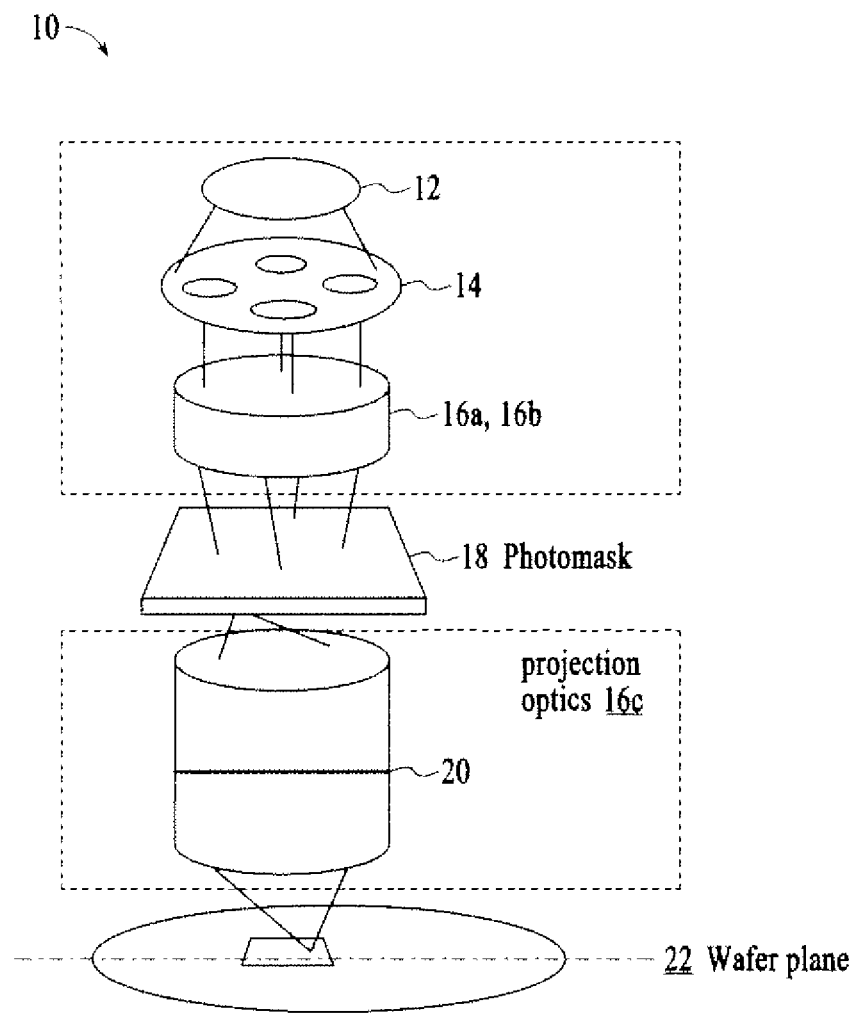
FIG. 1 is a block diagram of various subsystems of a lithography system according to example implementations of the present invention.

Prior to discussing the present invention, a brief discussion regarding the overall simulation and imaging process is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

Figure 2:
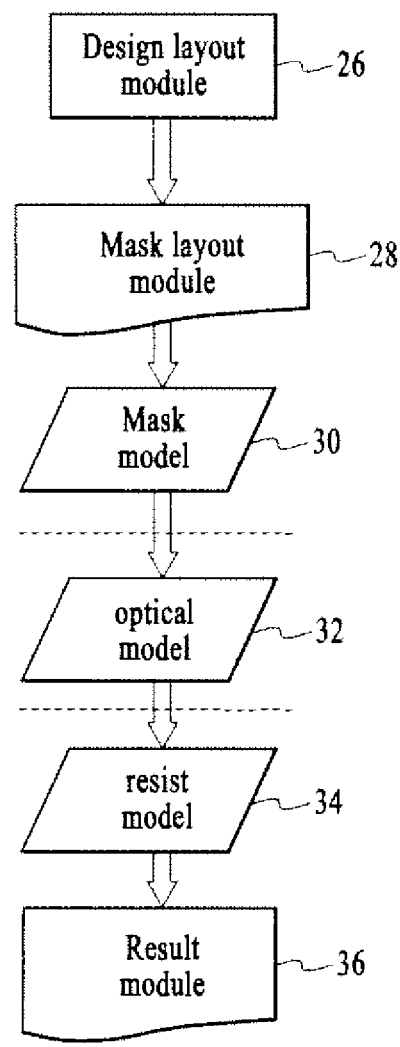
FIG. 2 is a block diagram of simulation models corresponding to the subsystems in FIG. 1.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask, as described, for example, in co-pending U.S. Pat. No. 7,587,704. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

In general, the connection between the optical and the resist model is a simulated aerial image within the resist layer, which arises from the projection of light onto the substrate, refraction at the resist interface and multiple reflections in the resist film stack. The light intensity distribution (aerial image) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

The CL model formulation is thus used to describe the known physics and chemistry, and each of the model parameters corresponds to a distinct physical or chemical effect; the model formulation sets an upper bound on how well the calibrated model can describe the reality.

The present inventors recognize that a preferred test pattern selection result (i.e. "pattern coverage") should therefore be able to excite all the known physics and chemistry in the model formulation, making sure that the wafer data for the test patterns can drive the model calibration to the optimal parameter values that realize the upper bound imposed by the formulation. Pattern selection does not change the physical and chemical effects contained in the model, but should preferably help to maximally excite these effects such that the degrees to which they manifest themselves in a specific lithography process can be efficiently identified based on the wafer measurements for the selected test patterns.

Figure 3:
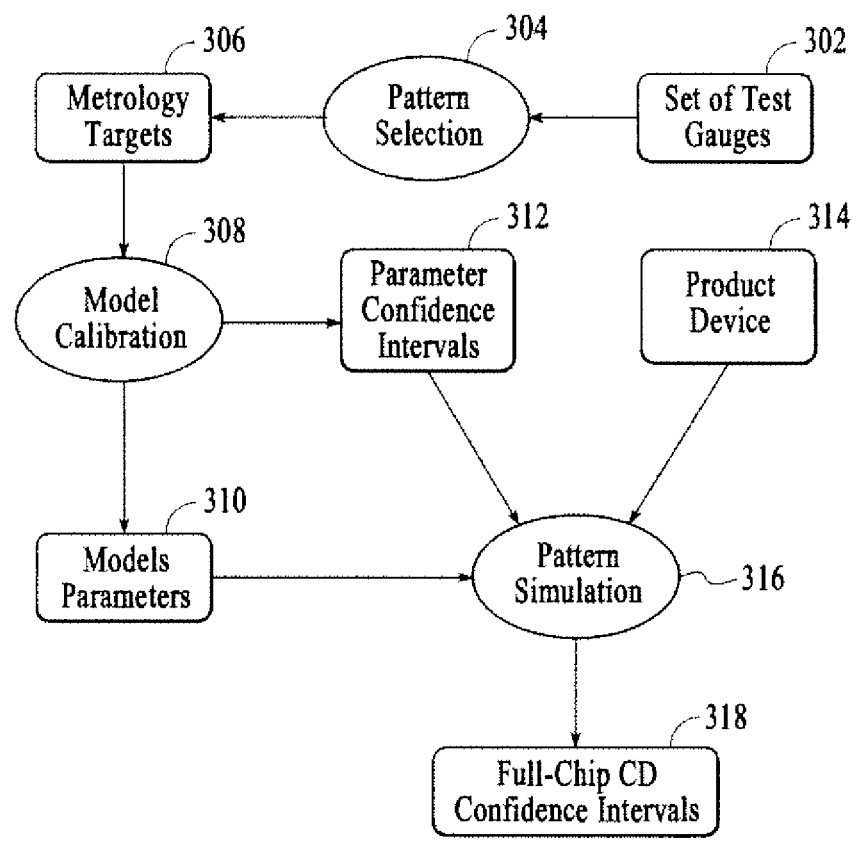
FIG. 3 is a flow diagram illustrating aspects of an example methodology of test pattern selection according to the invention.

More particularly, FIG. 3 is a flow diagram illustrating an example of how the test pattern selection methodologies according to aspects of the present invention are useful in calibrating a model that provides accurate and efficient CL results.

The invention mentioned generally above and to be described in more detail below includes selecting a test pattern 304 from a set of test gauges 302. The test pattern 304 provides metrology targets 306 for an actual exposure and wafer measurements using the selected test pattern 304, which are in turn used to calibrate a model 308 for the lithographic process used to perform the exposure. The calibrated model 308 provides model parameters 310 and the inherent measurement uncertainties of metrology targets 306 lead to associated parameter confidence intervals 312 (to be further described in more detail below). The model parameters 310 are to be used together with the product device 314 to perform pattern simulation 316 via CL techniques such as those described above. In the simulation procedure 316, the model parameter confidence intervals 312 will manifest themselves in full-chip CD confidence intervals 318 (to be further described in more detail below).

Using the approach described above, a general aspect of the invention is to select an optimal set of test patterns in step 304 from a pool of test patterns 302 as described in more detail below.

According to one aspect, the patterns are selected such that each test pattern is very sensitive to one or more specific model parameters 310, i.e., small changes in the parameters should be able to induce observable changes with good sigma-to-noise ratio in the wafer CD for the pattern. The patterns are further selected such that the effect of different model parameters can be clearly distinguished. Patterns with similar sensitivity to the model parameters 310 are identified, grouped and selected such that no unnecessary duplication of test patterns is retained in the selection results. By achieving the selection above, the smallest possible set of test patterns is identified that achieves high sensitivity to each of the individual parameters as well as clear distinction between the contributions from different model parameters 310.

The present inventors have identified a number of mathematical approaches that alone or in various combinations would be applicable in the selection of patterns 304 for optimal pattern coverage.

A first approach is to obtain Maximum sensitivity to each individual parameter 310. More particularly, within a neighborhood of a "nominal" CL model whose optical parameters come from scanner settings, and resist parameters from a first estimation, the test pattern CD "sensitivity" to model parameters, defined as $$S \equiv \frac{\partial CD}{\partial p}$$

can always be assumed to be a constant for each test pattern 302 with respect to each parameter. A naïve approach is then to select, for each individual model parameter, the test patterns that have the largest sensitivity to the parameter. One problem with this approach is that it does not guarantee the separation of effects from different parameters, i.e., the same set of patterns might be sensitive to two or more parameters, but can not uniquely determine which parameter or which combination of parameters actually induces the wafer CD change. This situation is referred to as "degeneracy" between parameters.

A next approach is to obtain a Maximum enclosed volume. This approach can also be described as "maximization of enclosed volume in sensitivity space". Denote the sensitivity of pattern g to model parameter p by $S_{pg}$ (p=1 ... P, g=1 ... G). Imagine a plot in the P-dimensional sensitivity space in which each point is a prospective test pattern, with coordinate $S_{pg}$ for the g'th point on the p'th axis. For a given target number N of selected patterns, we are trying to find the set of N patterns that results in the maximum enclosed volume in the sensitivity space. This approach prevents degeneracy because degeneracy will lead to small enclosed volumes. This concept alone does not lead to the concrete procedures to find the patterns that achieve this maximization.

A next approach is to perform Principal Component Analysis (PCA) on the sensitivity matrix $S_{pg}$. In this mathematically rigorous approach, the principal components of the matrix are the directions in the P-dimensional space that capture most variations in the sensitivities, and these directions are orthogonal (perpendicular) to each other. This way, the maximum sensitivity requirement and the least degeneracy requirement can be satisfied at the same time.

The next approach is to find a Confidence region 312 of model parameters: If it is desired to design a cost function as the optimization target, a choice that appears natural is to use the confidence region of the model parameters, which can be calculated as the trace of the inverse of the covariance matrix in the normal equation for the least-squares optimization (see descriptions below for the mathematical formulation). Minimization of this confidence region is equivalent to maximization of enclosed volume in sensitivity space. But some refinement will be needed to handle the interaction between the model parameters, since they have different units, and it is generally undesirable that the choice of units should result in some parameters being favored over the others in the pattern selection.

A next approach is to find a Confidence region of predictions of test pattern CD's 318. In order to deal with the problem of handling model parameters with different units, the algorithm calculates the model parameter uncertainties and simulates their impact on CD prediction uncertainty. The problem can be stated as follows: Find the set of N test patterns in the candidate pool of G test patterns that minimizes the sum-of-squared-errors uncertainty in the CD prediction for a target set of patterns—which can be the pattern pool G itself or another pattern pool from an actual product layout—as estimated from the confidence region of the model parameters.

Certain aspects of a Mathematical Formulation of cost functions based on the confidence regions (e.g. 312 and 318) mentioned above according to aspects of the invention will now be described in more detail.

Let p describe the actual physics and chemistry in the lithographical process, while m is a nominal model description of the process. Furthermore, let $p_p$ and $p_m$ represent the physical parameters and the nominal model parameters, and use a common parameter index j to signify the conceptual correspondence between actual parameters $p_{pj}$ and nominal model parameters $p_{mj}$.

Let CD denote the set of candidate test patterns from which to select an optimal subset of patterns for the actual model calibration; let $CD_p$ denote the set of measurement values for these patterns and $CD_m$ the set of nominal model predictions for the same patterns. The task of model calibration will then be determination of $p_{pj}$, given $p_{mj}$, $CD_p$, and $CD_m$ as input.

For the optical model parameters whose nominal value can be extracted from scanner settings, as well as for the resist model parameters for which a reasonable first estimation exists, the physical parameter $p_p$ and the nominal model parameter $p_m$ are sufficiently close to each other, such that a linear formulation is appropriate for the small neighborhood in the parameter space that covers both $p_p$ and $p_m$. In this formulation, the first order derivatives of $CD_m$ with respect to $p_j$, or the "linear sensitivities", are used to expand the full model in the small neighborhood under consideration. The simulated pattern sensitivity is defined as $$S_{m,ij} \equiv \frac{\partial CD_{m,i}}{\partial p_{m,j}}$$

and the task of model calibration becomes determination of $p_{p,j} - p_{m,j}$.

The pattern selection procedure will be based on this sensitivity matrix $S_m$, which is a G by P matrix. Assume that for the purpose of pattern selection, the sensitivity matrix calculated from a reasonably accurate initial model m will be sufficient. In the following discussions, the subscript m will be omitted for the sensitivity matrices.

Start from the linearized model calibration equation $$CD_{p,j} - CD_{m,i} = \Sigma_i S_{ij}(p_{p,j} - p_{m,j}),$$

this is usually an over-determined equation and $p_{p,j}$ are to be fitted in the least-squares sense. Considering the fact that wafer measurements $CD_{p,i}$ have inherent uncertainties (denoted $\sigma_i$), the equation may be rewritten in the matrix form Ax=b and solved using the normal equation formulation $(A^T A)x = A^T b$ where $$A_{ij} = S_{ij}/\sigma_i, x_j = p_{p,j} - p_{m,j}, b_i = (CD_{p,i} - CD_{m,i})/\sigma_i.$$

where the matrix A is the "normalized" sensitivity matrix (i.e. with metrology uncertainties considered).

It should be noted that in some implementations of the pattern selection algorithm, the actual wafer measurement uncertainties $\sigma_i$ are not known at the stage of pattern selection, but a reasonable estimation of their relative values can be achieved through model simulations. Studies on datasets for which wafer measurement data are available have shown that a linear correlation exists between the measurement uncertainties and the inverse of the image-log-slope (ILS) values evaluated on the contour points of the test patterns, defined as $$ILS = \frac{\partial AI / \partial x}{AI},$$

where AI is the aerial image as simulated by the model that uses nominal optical parameter values extracted from scanner settings, and x is along the direction of the CD measurement. This has the intuitive explanation that the smaller the ILS value, the smaller the imaging contrast, and therefore the more variation in wafer printing and wafer measurements. So in implementations of some embodiments detailed below, the inverse values of ILS thus simulated can be used as an estimation of wafer measurement uncertainties.

Covariance matrix $C \equiv [A^T A]^{-1}$ is closely related to the probable or standard uncertainties of the estimated parameters x, in that it is the covariance matrix of x:

$$\sigma^2(x_j) = C_{jj}, \text{Cov}(x_j, x_k) = C_{jk}$$

See, for example, "Numerical Recipes in C, The Art of Scientific Computing," 2nd ed., W. H. Press, S. A. Teukolsky, W. T. Vetterling, and B. P. Flannery, Chap. 15, Cambridge University Press, 1992.

A confidence region 312 for the parameters can be derived from the covariance matrix. If we choose to minimize the "size" of this confidence region 312 (defined as the sum of squared principal axis dimensions of the confidence ellipsoid, or the sum of squared uncertainty level of individual parameters) at a certain confidence level, this cost function will in fact be equal to the trace of matrix C.

The cost function definition above contains an undesirable arbitrariness due to the artificial choice of parameter units. One alternative to avoid this is to project the estimated covariance matrix of the parameters to CD prediction errors over a larger pattern space, and use the sum of squared error for all the pattern CD predictions 318 as the cost function. In practice, a pre-determined set of representative patterns can be used to emulate the full-chip pattern behavior. If the "full-chip" pattern set has the sensitivity matrix of S, this updated cost function will take the form of $$\sum_{CD \in \text{full chip pattern set}} \sigma^2(CD_j) = Tr[SCS^T] = Tr[S[A^T A]^{-1} S^T]$$

and the minimization of this function will be used to drive pattern selection in our final implementation.

To achieve the minimization of the cost function described above, embodiments of the invention perform principal component analysis on the full-chip sensitivity matrix S, and identify the directions in the P-dimension sensitivity space along which most variations in S are distributed. The test patterns 302 in the pool of candidate patterns whose sensitivity are most aligned with these principal directions are searched for and identified, because they will be the most efficient ones in reducing the cost function.

FIG. 4 is a flowchart of an example step-by-step implementation of a pattern selection method according to aspects of the invention.

In step 402, proper initial estimates of model parameters are created by using, for example, any combination of machine setting data, on-tool metrology data and tool design data. In step 404, a "full-chip" pattern set that is representative of the pattern variety in the product on which the CL model is to be used is also pooled.

In step 406, based on this initial model estimate, the sensitivities for both the candidate patterns and the "full-chip" patterns to each of the model parameters that will be calibrated during the calibration process are calculated. This results in a sensitivity matrix S for the full-chip pattern set and a normalized sensitivity matrix A for the candidate pattern set (step 408). Each sensitivity matrix can also be visualized as a sensitivity "cloud" in the P-dimensional sensitivity space, with each test pattern corresponding to a point, whose coordinates are the test pattern's sensitivity to the parameters. Accordingly, the following discussions sometimes use the terms "sensitivity matrix" and "sensitivity cloud" interchangeably.

In steps 410 and 412, PCA is performed on the points in the sensitivity cloud S for the full-chip pattern set. More particularly, the principal components that capture the most sensitivity variations, as well as their respective contributions to the overall sensitivity variation (which are also the singular vectors and singular values in singular value decomposition of the sensitivity matrix) are calculated.

In step 414, each sensitivity point in the normalized candidate pattern set A is projected onto the new coordinate system defined by the PCA in the previous step, where each axis aligns with the direction of one of the principal components (singular vectors) of S. The square root of the corresponding singular value is used as a scaling factor for each axis, such that the direction along which exist more sensitivity variations receives a higher priority in the selection procedure. This leads to a "normalized" sensitivity cloud (step 416) for the candidate pattern set in the coordinate system defined by PCA.

of G-P candidate patterns until again the dimensionality of the parameter space is exhausted and we have selected an additional set of P patterns.

The process in step 426 can be repeated over and over until the candidate pattern pool is exhausted. At that point, in step 428, the process has created a rank-order of all original G candidate patterns in terms of their effectiveness for model calibration. This rank-ordered list can be truncated at the desired target of N patterns.

In step 430, the resulting confidence interval on predictions of full-chip patterns is used to monitor the selection procedure and to provide the estimated performance of the selected set of test patterns in step 432.

Figure 5A:
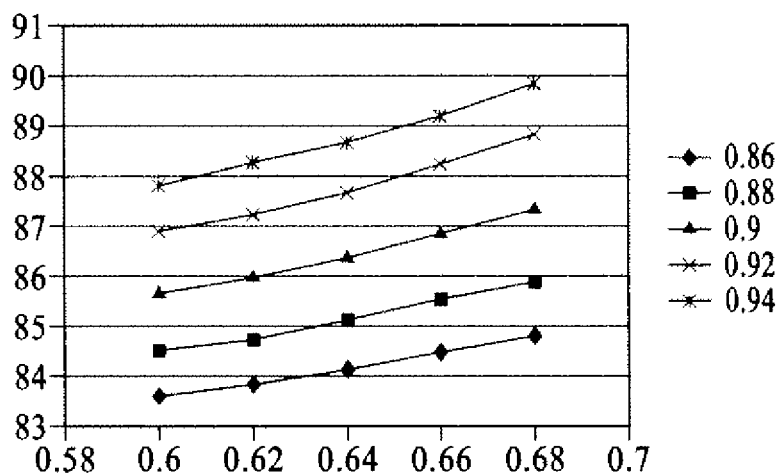
FIGS. 5A and 5B and 6A and 6B are charts illustrating example results of using a methodology according to embodiments of the invention.
Figure 5B:
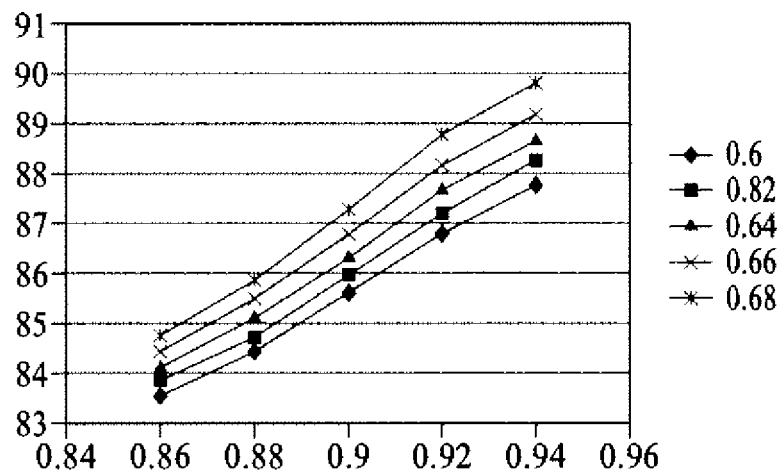

As shown in FIGS. 5A and 5B, the present inventors first verified the linearity assumption discussed above that underlies the formal mathematics of the approach according to aspects of the invention. FIG. 5A shows the linearity for 100 nm lines at 170 nm pitch imaged on an ASML scanner XT:1400 under variations in $\sigma_{inner}$ (left) and FIG. 5B shows the linearity for 100 nm lines at 170 nm pitch imaged on an ASML scanner XT:1400 under variations in $\sigma_{outer}$ (right). As can be seen from FIGS. 5A and 5B, in this case the response is indeed sufficiently linear in the small neighborhood under consideration.

As a second step, the present inventors performed the PCA analysis of the sensitivity matrix for the full set of 3500 patterns on the ASML test mask called Proxi45, which is used as the pool of candidate patterns. The results are given in TABLE 1 below, where each row is a principal direction in the sensitivity space, each column is sensitivity to a particular CL model parameter (e.g. NA, sigma center, sigma width, Rx, dose, ellipticity, etc.) with its contribution to overall sensitivity variations (also known as "singular values") listed in the last column.

TABLE 1

| rank | unitary principal directions | | | | | | singular value |
|---|---|---|---|---|---|---|---|
| 5 | −0.000111726 | 0.000148 | 5.41E−05 | −1 | 0.000169 | 6.17E−05 | 0.4518808 |
| 4 | −0.0526388 | 0.007952 | 0.059668 | 0.000178 | 0.996771 | −0.007359 | 213.305 |
| 3 | 0.453597 | 0.271767 | −0.728595 | −1.18E−05 | 0.068575 | 0.42993 | 1300.12 |
| 2 | 0.196294 | 0.159036 | −0.34868 | −6.90E−05 | 0.023309 | −0.90225 | 1448.147 |
| 1 | −0.206718 | 0.947798 | 0.23885 | 0.000173 | −0.032562 | 0.028945 | 4123.796 |
| 0 | −0.842743 | −0.049665 | −0.535689 | 5.67E−05 | −0.011934 | 0.01461 | 9768.81 |
| | NA | sigma center | sigma width | Rx | dose | ellipticity | |

In step 418, the pattern with the largest overall (weighted) sensitivity, i.e. with the largest Euclidean distance to the origin, is identified from the normalized sensitivity cloud determined in step 416. In step 420, this pattern is added to the set of selected patterns and the sensitivity space is reduced to a lower dimension by removing the sensitivity direction of the selected test pattern. In other words, all other sensitivity vectors in the candidate pattern pool are orthogonalized with respect to the selected direction.

In step 422, steps 418 through 420 are repeated for the rest of the pattern set until the dimensionality of the sensitivity space is fully exhausted.

By this point, the process has achieved coverage for every parameter, i.e., no parameter will be left unconstrained in the model calibration stage. Within the metrology time limitation, it would be desirable to include more patterns to enhance the coverage.

Figure 6A:
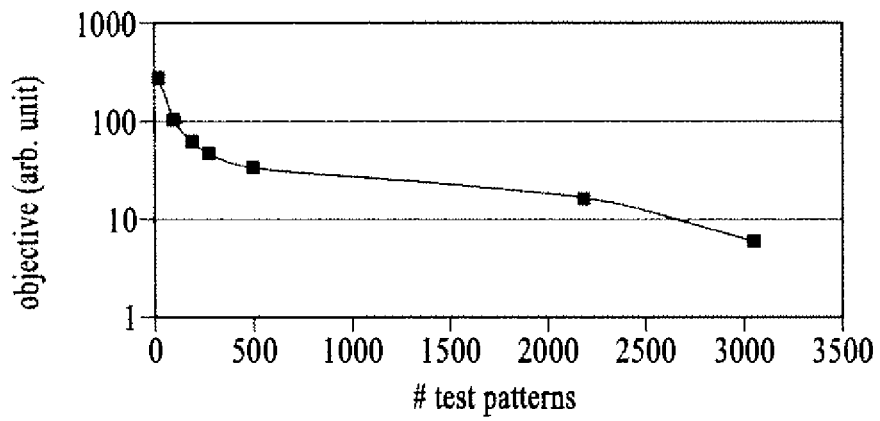

Therefore, as shown in steps 424 and 426, steps 412 through 418 are repeated a second time on the remaining set Applying the procedures described above, we have selected from the pattern pool a few sets of test patterns with different pattern counts, and proceed to evaluate their performance by calculating the sum-of-squared errors of the predictions for the full-chip pattern set, in this case the same 3500 patterns from the Proxi45 reticle. The resulting performance is shown in FIG. 6A.

Figure 6B:
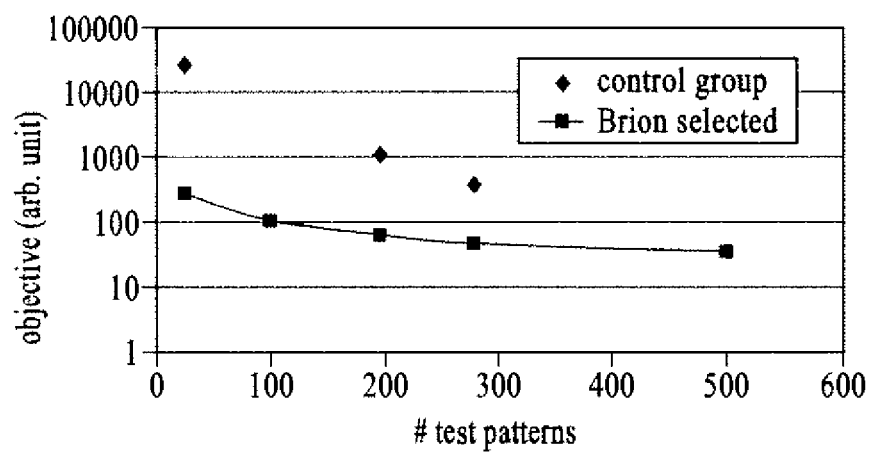

FIG. 6B, for comparison, shows the pattern selection results obtained from the present algorithm as compared to the performance of more traditional pattern selections ("control groups") using the same full-chip CD prediction metric. As can be seen, the pattern sets selected according to the invention perform substantially better in terms of pinning down the model calibration parameters in such a manner as to quickly minimize the prediction uncertainty on CD's of the full-chip pattern set when the resulting models are used.

The innovations of the present application have applicability to, but not restricted to, the following areas: Calibration of arbitrary CL models that conform to the linear formulation or can be linearly expanded; in particular; Calibration of differential models for scanner matching, i.e., fine adjustments of the models for individual scanners based on wafer measurements for these scanners, when a fully-calibrated baseline model for a reference scanner already exists; and Calibration of resist parameters in a linear resist model that takes the form of a summation of multiple resist terms.

Moreover, although the invention has been described in an example application of model calibration, it is possible that aspects of the invention can be applied to individual terms in resist modeling, differential optical modeling, and selection of model form.

Figure 7:
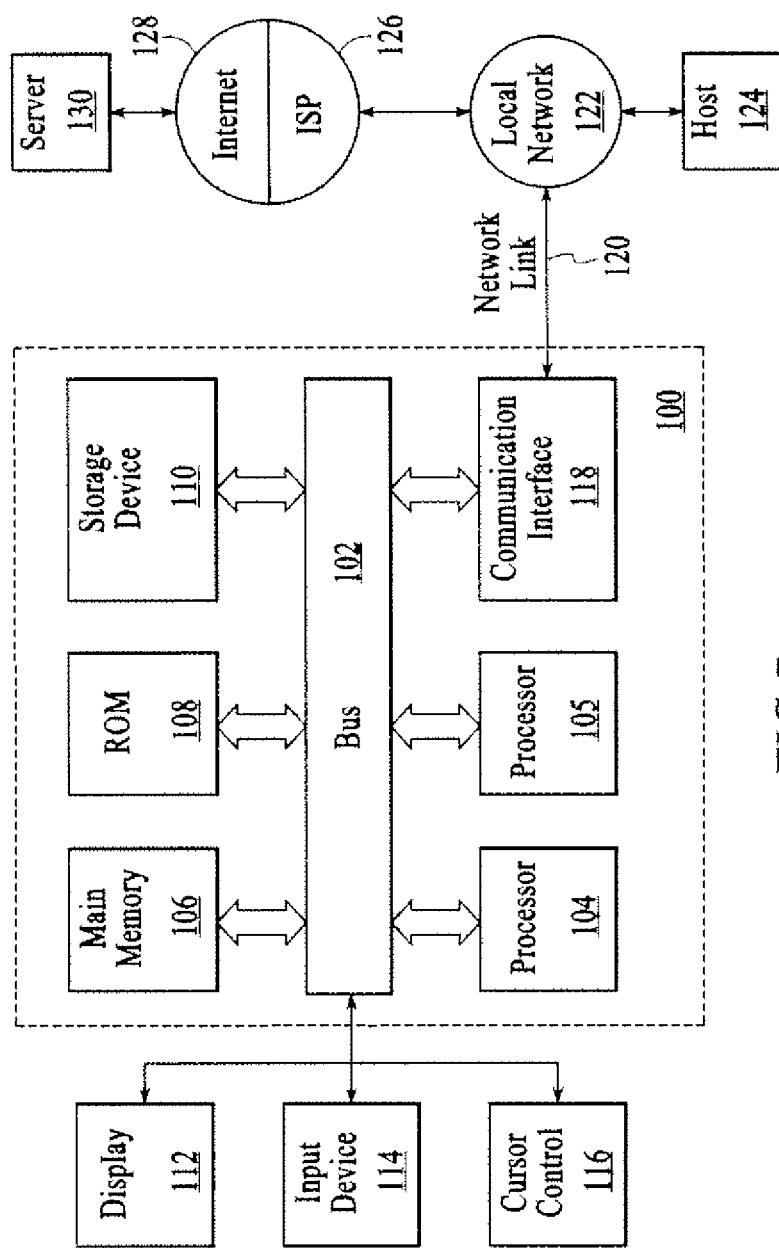
FIG. 7 is a block diagram of an example computer system in which embodiments of the invention can be implemented.

FIG. 7 is an exemplary block diagram that illustrates a computer system 100 which can assist in embodying and/or implementing the pattern selection method disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
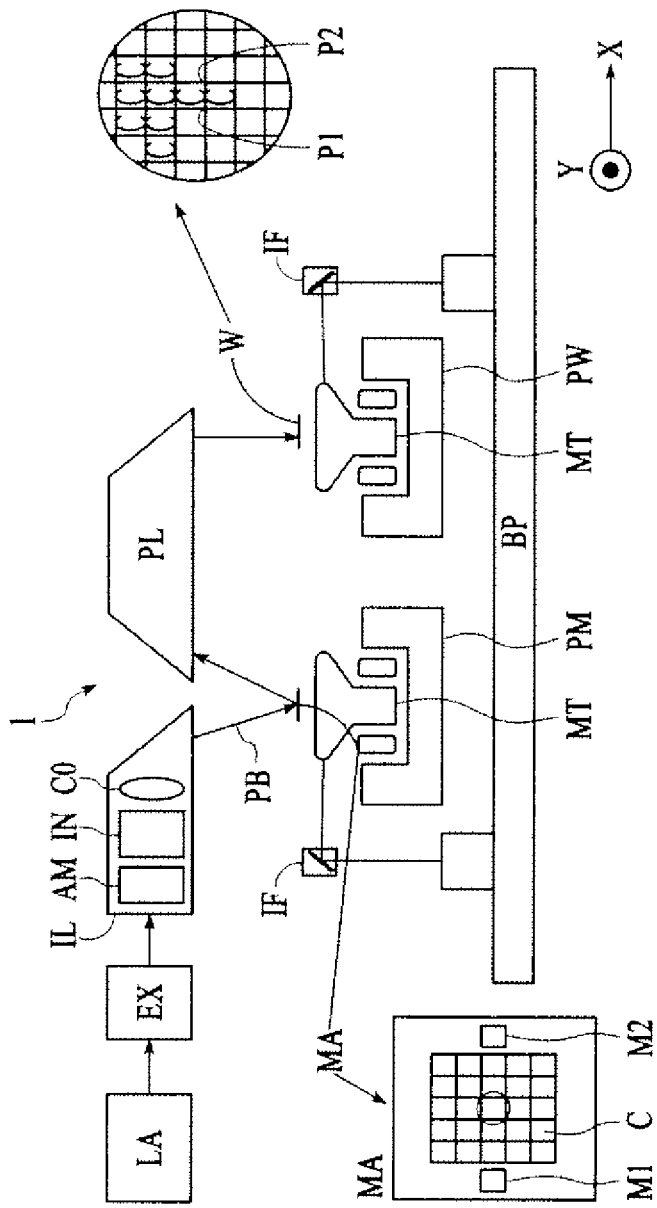
FIG. 8 is a block diagram of a lithographic projection apparatus to which embodiments of the invention are applicable.

FIG. 8 schematically depicts an exemplary lithographic projection apparatus whose performance could be simulated and/or optimized utilizing the computational lithography models that are calibrated using the test pattern selection process of present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a reflective type (i.e., has a reflective mask). However, in general, it may also be of a transmissive type, for example (with a transmissive mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 8 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A computer-implemented method of test pattern selection for computational lithography model calibration, the method comprising:

preparing a sensitivity matrix having matrix elements corresponding to, and thereby defining a sensitivity relationship between, a pool of candidate test patterns and a set of model parameters, wherein the matrix elements quantify how changes in measurements from imaging the test patterns using a lithographic process corresponding to the set of model parameters are induced by changes in the set of model parameters;

performing calculations using the sensitivity matrix; and selecting, by the computer, a set of test patterns from the pool of candidate test patterns based on the calculations using the sensitivity matrix.

2. A method according to claim 1, wherein the selecting step includes:

identifying which test pattern of the pool of candidate test patterns has the greatest sensitivity to certain of the set of model parameters; and adding the identified candidate test pattern to the set of test patterns.

3. A method according to claim 2, further comprising repeating the performing, identifying and adding steps until test patterns corresponding to all of the set of model parameters have been added to the selected set of test patterns.

4. A method according to claim 1, wherein the step of performing calculations includes performing principal component analysis on the sensitivity matrix.

5. A method according to claim 1, wherein the step of preparing the sensitivity matrix includes estimating wafer measurement uncertainties based on a simulated aerial image corresponding to the pool of candidate test patterns.

6. A method according to claim 1, wherein the step of preparing the sensitivity matrix includes simulating an aerial image based on a mask including the pool of candidate test patterns and using nominal values of certain of the set of model parameters.

7. A method according to claim 1, wherein the selecting step includes minimizing a cost function related to model accuracy.

8. A method according to claim 7, wherein the cost function represents CD prediction errors for a certain pool of patterns, including a full chip pattern set.

9. A method according to claim 1, wherein preparing the sensitivity matrix includes calculating G×P distinct matrix elements, where G is the number of test patterns in the pool of candidate test patterns, and P is the number of the set of model parameters.

10. A method according to claim 1, wherein preparing the sensitivity matrix includes calculating changes in measurements associated with the pool of candidate test patterns as a function of changes in the set of model parameters.

11. A computer-implemented method of test pattern selection for computational lithography model calibration, the method comprising:

developing a sensitivity matrix that corresponds to a cost function associated with accuracy of a lithography model, wherein the sensitivity matrix establishes a relationship between a pool of candidate test patterns and a set of parameters of the lithography model, and wherein the sensitivity matrix comprises matrix elements that quantify how changes in measurements from imaging the test patterns using a lithographic process corresponding to the lithography model are induced by changes in the set of parameters of the lithography model; and selecting, by the computer, a set of test patterns from the pool of candidate test patterns by performing calculations on the sensitivity matrix.

12. A method according to claim 11, wherein the selecting step includes:

determining which one of the candidate test patterns has a greatest sensitivity to an identified model parameter using results of the calculations; and adding the determined test pattern to the selected set of test patterns.

13. A method according to claim 12, further comprising repeating the performing, determining and adding steps until test patterns corresponding to all of the set of model parameters have been added to the set of test patterns.

14. A method according to claim 11, wherein the step of performing calculations includes performing principal component analysis on the sensitivity matrix.

15. A method according to claim 11, wherein the selecting step is performed so as to minimize a cost function.

16. A method according to claim 15, wherein the cost function represents CD prediction errors for a certain pool of patterns, including a full chip pattern set.

17. A method according to claim 11, wherein the step of developing the sensitivity matrix includes estimating wafer measurement uncertainties based on a simulated aerial image corresponding to the pool of candidate test patterns.

18. A method according to claim 11, wherein the step of developing the sensitivity matrix includes simulating an aerial image based on a mask including the pool of candidate test patterns and using nominal values of certain of the set of model parameters.

19. A method according to claim 11, wherein developing the sensitivity matrix includes calculating G×P distinct matrix elements, where G is the number of test patterns in the pool of candidate test patterns, and P is the number of the set of model parameters.

20. A method according to claim 11, wherein developing the sensitivity matrix includes calculating changes in measurements associated with the pool of candidate test patterns as a function of changes in the set of model parameters.

* * * * *